United States Patent
Ishii et al.

(10) Patent No.: US 8,933,422 B2
(45) Date of Patent: Jan. 13, 2015

(54) CHARGED PARTICLE BEAM DEVICE

(75) Inventors: Ryoichi Ishii, Hitachinaka (JP); Takashi Doi, Hitachinaka (JP); Osamu Sato, Kasumigaura (JP); Yasushi Ebizuka, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 13/812,842

(22) PCT Filed: Jun. 8, 2011

(86) PCT No.: PCT/JP2011/003213
§ 371 (c)(1),
(2), (4) Date: Apr. 5, 2013

(87) PCT Pub. No.: WO2012/014362
PCT Pub. Date: Feb. 2, 2012

(65) Prior Publication Data
US 2013/0200271 A1 Aug. 8, 2013

(30) Foreign Application Priority Data
Jul. 28, 2010 (JP) ................................ 2010-168773

(51) Int. Cl.
*H01J 37/18* (2006.01)
*H01J 37/16* (2006.01)

(52) U.S. Cl.
CPC ............... *H01J 37/18* (2013.01); *H01J 37/16* (2013.01); *H01J 37/185* (2013.01); *H01J 2237/2001* (2013.01); *H01J 2237/2802* (2013.01)
USPC .................. 250/492.1; 250/492.2; 250/492.3

(58) Field of Classification Search
None
See application file for complete search history.

(56) References Cited

U.S. PATENT DOCUMENTS 2,508,317 A * 5/1950 Verhoeff .................. 250/441.11
4,020,353 A * 4/1977 Saito et al. ............... 250/441.11
(Continued)

FOREIGN PATENT DOCUMENTS

JP 3-022333 A 1/1991
JP 03022333 A * 1/1991 ............. H01J 37/18
(Continued)

OTHER PUBLICATIONS

International Search Report issued in International Application No. PCT/JP2011/003213 mailed on Sep. 27, 2011.

*Primary Examiner* — Andrew Smyth
(74) *Attorney, Agent, or Firm* — McDermott Will & Emery LLP (57) ABSTRACT

The objective of the present invention is to provide a charged particle beam device such that a tip part can be effectually maintained in a clean state, while the frequency of valve body replacements is also reduced. To achieve the objective, a charged particle beam device is offered, comprising: a partition that is positioned between a charged particle source-side vacuum space and a specimen stage-side vacuum space, said partition further comprising an opening for a charged particle beam to pass through; a driver mechanism that moves a shutter member between a first location within the optical axis of the charged particle beam and a second location outside the optical axis of the charged particle beam; and a control device that controls the driver mechanism. The first location is a location wherein the shutter member is distanced from the partition, and the control device carries out a control that opens a valve between the specimen chamber and the exchange chamber when the shutter member is in a state of being located in the first location.

5 Claims, 6 Drawing Sheets

1 ··· ELECTRON GUN  1a ··· ELECTRON SOURCE  2 ··· MIRROR BODY
3 ··· CONDENSER LENS  4 ··· OBJECTIVE LENS  5 ··· GATE VALVE
6, 6a, 6b, 6c ··· WAFER  7 ··· SPECIMEN STAGE
8 ··· SPECIMEN CHAMBER VALVE  9 ··· SPECIMEN CHAMBER
9a ··· SPECIMEN CHAMBER PUMP  10 ··· EXCHANGE CHAMBER
10a ··· EXCHANGE CHAMBER PUMP  11 ··· LOCAL EXHAUST CHAMBER
12 ··· ROBOT  13 ··· WAFER CASING  14 ··· EXCHANGE CHAMBER VALVE
15 ··· VALVE BODY RECEPTACLE  16 ··· VALVE BODY  17 ··· APERTURE
18 ··· VALVE BODY DRIVE ASSEMBLY

(56) References Cited

U.S. PATENT DOCUMENTS

| | | | |
|---|---|---|---|
| 4,066,905 A * | 1/1978 | Dassler et al. | 250/396 R |
| 5,026,995 A * | 6/1991 | Hazaki et al. | 250/442.11 |
| 6,448,567 B1 * | 9/2002 | Botelho et al. | 250/492.21 |
| 8,348,234 B2 * | 1/2013 | Duelli | 251/204 |

FOREIGN PATENT DOCUMENTS

| | | | | | |
|---|---|---|---|---|---|
| JP | 5-203123 A | | 8/1993 | | |
| JP | 05203123 A | * | 8/1993 | ............. | F23D 14/22 |
| JP | 6-294481 A | | 10/1994 | | |
| JP | 06294481 A | * | 10/1994 | ............... | F16L 5/00 |
| JP | 2001-236910 A | | 8/2001 | | |
| JP | 2001236910 A | * | 8/2001 | ............. | H01J 37/04 |
| JP | 2001-325912 A | | 11/2001 | | |
| JP | 2001325912 A | * | 11/2001 | ............. | H01J 37/20 |
| JP | 2005-203123 A | | 7/2005 | | |
| JP | 2005203123 A | * | 7/2005 | ............. | H01J 37/18 |
| JP | 2007-157682 A | | 6/2007 | | |
| JP | 2007157682 A | * | 6/2007 | | |

* cited by examiner

FIG. 1

1 ··· ELECTRON GUN   1a ··· ELECTRON SOURCE   2 ··· MIRROR BODY
3 ··· CONDENSER LENS   4 ··· OBJECTIVE LENS   5 ··· GATE VALVE
6, 6a, 6b, 6c ··· WAFER   7 ··· SPECIMEN STAGE
8 ··· SPECIMEN CHAMBER VALVE   9 ··· SPECIMEN CHAMBER
9a ··· SPECIMEN CHAMBER PUMP   10 ··· EXCHANGE CHAMBER
10a ··· EXCHANGE CHAMBER PUMP   11 ··· LOCAL EXHAUST CHAMBER
12 ··· ROBOT   13 ··· WAFER CASING   14 ··· EXCHANGE CHAMBER VALVE
15 ··· VALVE BODY RECEPTACLE   16 ··· VALVE BODY   17 ··· APERTURE
18 ··· VALVE BODY DRIVE ASSEMBLY

FIG. 2

20 ··· TUNGSTEN SINGLE-CRYSTAL CHIP   21 ··· HAIRPIN FILAMENT
22 ··· TERMINAL   23 ··· CERAMIC INSULATOR   24 ··· ZIRCONIUM
25 ··· OXYGEN

FIG. 3

30 ··· PRESSING METAL PIECE  31 ··· ELECTRON PASSAGE
32 ··· SEALING MEMBER  33 ··· SHAFT  34 ··· SPRING
35 ··· VACUUM SEALING STATE  36 ··· INTERMEDIATE STATE
37 ··· OPEN STATE

CHARGED PARTICLE BEAM DEVICE

RELATED APPLICATIONS

This application is the U.S. National Phase under 35 U.S.C. §371 of International Application No. PCT/JP2011/003213, filed on Jun. 8, 2011, which in turn claims the benefit of Japanese Application No. 2010-168773, filed on Jul. 28, 2010, the disclosures of which Applications are incorporated by reference herein.

TECHNICAL FIELD

The present invention relates to a charged particle beam device, and particularly relates to a charged particle beam device in which a valve body is provided between a charged particle source of the charged particle beam device and a specimen chamber in which a specimen on which a charged particle beam is irradiated is disposed.

BACKGROUND ART

A charged particle beam device represented by an electron scanning microscope needs to maintain an optical system and a specimen chamber in a vacuum, and when an electron beam is irradiated, an electron optical system and the specimen chamber is evacuated. Furthermore, an atmosphere surrounding an electron source (charged particle source) emitting an electron beam needs to maintain an extremely high degree of vacuum. The technology of blocking an atmosphere on the specimen chamber side in which the degree of vacuum is lowered or could be lowered from an atmosphere on the electron source side when the specimen is replaced, is disclosed in Patent Literatures 1 to 3.

CITATION LIST

Patent Literature

Patent Literature 1: JP-A-03-22333
Patent Literature 2: JP-A-05-203123
Patent Literature 3: JP-A-06-294481

SUMMARY OF INVENTION

Technical Problem

A valve body disclosed in Patent Literatures 1 to 3 is disposed in two vacuum spaces having different pressure and used to maintain the pressure difference between them, so that the valve body needs to be strongly pressed to an opening between the vacuum spaces. However, in this case, as the valve body with a seal function while being made of a soft material compared to an inner structure of an electron microscope has to be strongly pressed, its contact surface is deteriorated, so that replacement of the corresponding member has been required with a proper frequency.

While one original reason of providing the valve body is to maintain a tip part of the electron source in clean, according to the review of the present inventors, it is found that cleanliness is deteriorated when gas component and moisture remaining in the vacuum chambers linearly pass a portion near a beam optical axis to be attached to a chip.

Hereinafter, a charged particle beam device of which object is such that a chip part can be effectually maintained in a clean state, while the frequency of valve body replacements is also reduced will be explained.

Solution to Problem

As one aspect to achieve the above-described object, there is suggested a charged particle beam device including: a charged particle source; a specimen stage that maintains a specimen on which a charged particle beam emitted from the charged particle source is irradiated; a specimen chamber that sets an atmosphere in which the specimen exists as a vacuum state; and an exchange chamber that evacuates a specimen atmosphere to be introduced to the specimen chamber, the charged particle beam device further including a partition that is located between a charged particle source-side vacuum space and a specimen stage-side vacuum space, the partition further including an opening for the charged particle beam to pass through, a drive mechanism that moves a shutter member between a first location within an optical axis of the charged particle beam and a second location outside the optical axis of the charged particle beam and a control device that controls the drive mechanism, wherein the first location is a location in which the shutter member is distant from the partition, and the control device carries out control for opening a valve between the specimen chamber and the exchange chamber when the shutter member is in a state of being located in the first location.

Advantageous Effects of Invention

According to the above configuration, a passage route of gas component etc. communicating between the charged particle source-side space and the specimen stage-side space can be blocked without the need of pressing the shutter member to other members, which achieves not only a long-life shutter member but also maintenance of cleanliness of a surface of the chip of the charged particle source.

DESCRIPTION OF EMBODIMENTS

Recently, miniaturization of a semiconductor device is advanced, and along with this situation, a higher resolution and a higher throughput have been required for en electron scanning microscope that measures or tests the semiconductor device. In addition, enhancing an operation rate of the device is also important. To improve the operation rate of the device, the stop time of the device caused by replacement or maintenance of an electron source etc. has to be shortened as much as possible.

Since the electron source is an expendable item, a stable and long-time extraction of its output is desired. Among the electron sources, a Schottky emission electron source includes a hairpin filament made of a W <100> single-crystal chip and a W polycrystalline line, a terminal of stainless steel, etc. in which a filament is spot-welded, and a ceramic insulator. It is configured such that an oxide supply source such as Zr whose work function is lower than that of the W single-crystal chip is attached a central portion, a root or a filament of the W single-crystal chip. By heating the electron source at a temperature of 1,500 to 1,900K, its oxide is thermally diffused along the W single-crystal chip. The metal oxide diffused on a tip portion of the W single-crystal chip is adsorbed on a tip portion of the W single-crystal chip as respective nearly-monoatomic layers of the oxide and the metal. At this time, the adsorption is selectively performed on a specific crystal surface (100) having a high activation energy of surface diffusion and desorption. By using the W single-crystal line in which the (100) crystal surface is a tip portion of the W single-crystal chip, only the tip portion of the W single-crystal chip can be maintained in a state of low work function. Consequently, a high emission electronic current density can be obtained from that portion.

As such Schottky electron sources, Zr/O/W is disclosed in Journal of Vacuum Science Technology, B3(1), 1985, p. 220.

On the other hand, in a length measurement-type electron scanning microscope for measuring a pattern width of a semiconductor device (Critical Dimension Scanning Electron Microscope: CD-SEM) and an electron scanning microscope for reviewing a defect based on positional information of the defect (Defect Review SEM: DR-SEM) etc., measurement or testing of many specimens for unit time is required, however, if a replacement frequency of wafers becomes higher, the number of times of opening and closing of a gate valve and an exchange chamber is increased. Moreover, for each opening and closing, pressure in a vacuum chamber could fluctuate. In a case where a turbopump is used as an air displacement pump that evacuates the vacuum chamber, gas remains in the vacuum chamber etc. unless baking is performed. Also, to discharge remaining moisture, baking is needed with high frequency (Vacuum Handbook (new edition), ULVAC, Inc., 1.6 vacuum gauge and potentiometer, P.38 to P.39, Residual Gas Component of Vacuum System C).

When such moisture and the like remain in the vacuum chamber for a long period of time, it is decomposed into hydrogen and oxygen. On the other hand, it is known that zirconium (Zr) as a catalyst of an electron source used for an electron gun has such a high affinity for oxygen that it is used as an oxymeter. The electron source existing on the uppermost portion of the beam optical axis of the electron scanning microscope is attached to a surface of the single-crystal chip when the above decomposed molecules pass the shortest route of a mean free path along the beam optical axis to thereby affect surface diffusion and a desorption phenomenon.

Since the Schottky emission electron source has to be maintained in a high vacuum atmosphere while it can take out an electron beam with high brightness, it is separated from a specimen chamber and is differentially evacuated. However, an opening for an electron beam to pass has to be provided, so that a molecule could pass through the opening to be attached to the electron source. In particular, in response to requirement of high throughput of recent years, replacement frequency of a specimen (for example, semiconductor wafer) has been increased. As a result, pressure of the specimen chamber is frequently fluctuated. Along with this pressure fluctuation, the electron source also receives the above influence.

The influence on the electron source based on the pressure fluctuation of the specimen chamber can be mitigated to some extent by providing a shutter mechanism that blocks an atmosphere in the electron source-side space from an atmosphere in the specimen chamber-side space, however, frequent opening and closing of the shutter mechanism for securing the pressure difference between both spaces provide concern for deterioration of the shutter mechanism. Accordingly, in the following explanation, a charged particle beam device which achieves both inhibition of deterioration of the shutter mechanism and inhibition of influence on the electron source accompanied by pressure fluctuation of the specimen chamber will be explained in detail with reference to the drawings.

In this embodiment, an electron scanning microscope in which a shutter member is located such that it is not pressed to an opening provided on a partition that separates an electron source-side vacuum atmosphere from a specimen chamber-side vacuum atmosphere and that it is located on an electron beam optical axis will be explained.

According to one aspect of this embodiment, a charged particle beam device by which replacement frequency due to protection of a chip of an electron gun and longevity of a valve O-ring is reduced, the device stop time due to the replacement can be reduced, and the operation time is increased can be provided.

As a result of the research by the present inventors, the inventors have newly found that most of molecules having a possibility of reaching the electron source move linearly along the electron beam optical axis. That is, the molecules can be prevented from reaching the electron source by locating the shutter mechanism at a location that the opening of the partition and the shutter member are overlapped seen from the direction of the electron source, instead of pressing the shutter member to the partition.

Hereinafter, the electron scanning microscope that can locate the shutter member to a location that does not contact the partition provided between the electron source-side vacuum atmosphere and the specimen chamber-side vacuum atmosphere in the electron beam optical axis will be explained with reference to the drawings. Additionally, while an electron scanning microscope having a Schottky emission electron source will be explained as an example of the charged particle beam device in this embodiment, this is applicable to any device in which a beam source could be influenced by molecules from the specimen chamber. As other examples of the charged particle beam device, an electron scanning microscope having a field-emission electron source and a focused ion beam system etc. can be listed.

Figure 1:
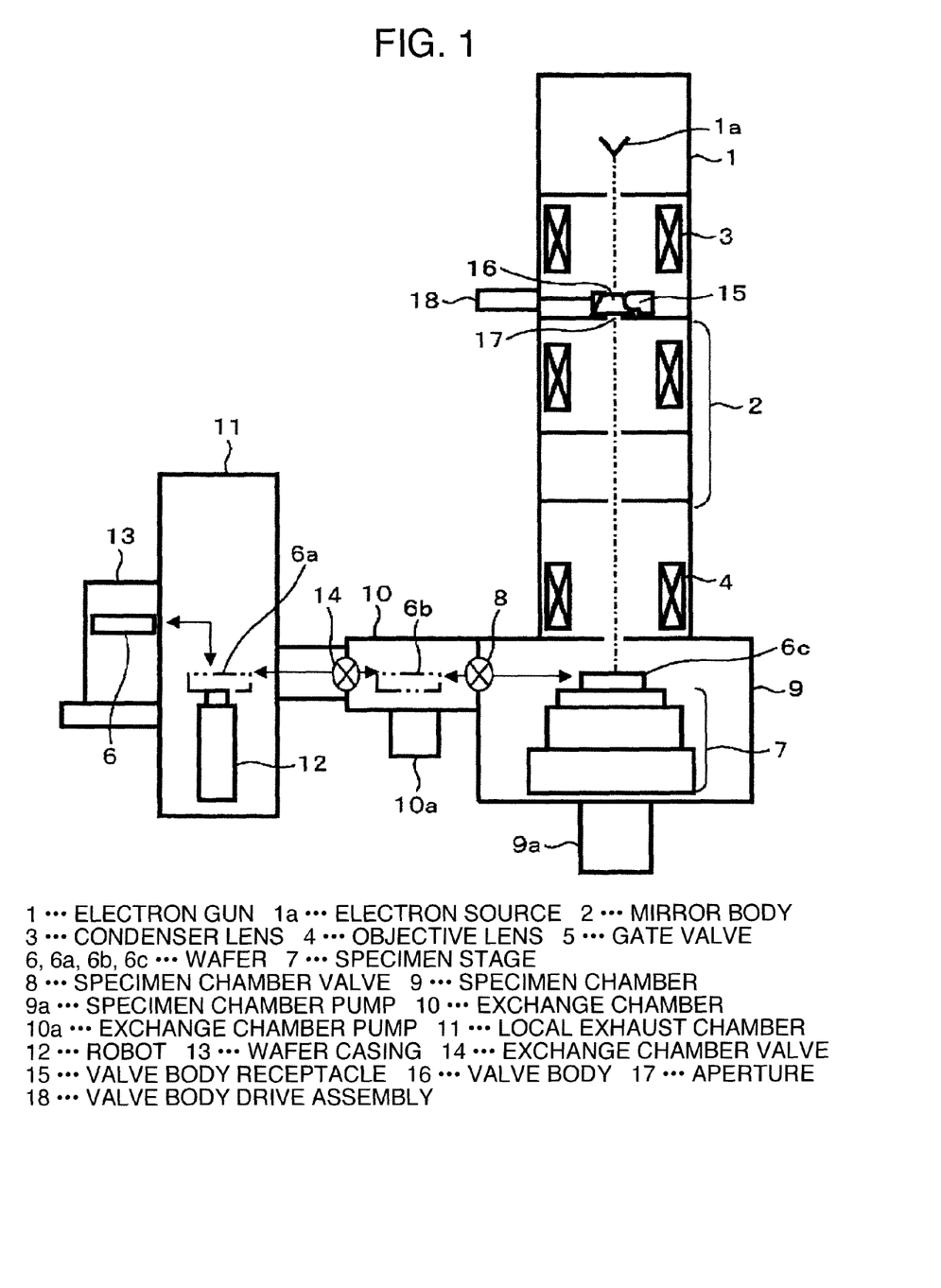
FIG. 1 is a schematic configuration diagram of an electron scanning microscope.

FIG. 1 is a schematic configuration diagram of an electron scanning microscope. An electron beam emitted from an electron gun 1 including an electron source is focused on a wafer 6 by a condenser lens 3 and an objective lens 4 in a condensed manner. A deflector (not shown) scans the electron beam on the wafer 6. From a scanning area of the electron beam on the wafer 6, a secondary electron (SE) or a backscattered electron (BSE) is emitted, and in the electron scanning microscope, a detector that detects these electrons is provided (not shown). The electron detected by the detector is converted into an optical signal and amplified by a not-shown amplifier. This amplified signal is displayed on a display as a two-dimensional image or stored in a frame memory by synchronizing with a scanning signal of the not-shown deflector. Moreover, the detected signal forms a profile waveform and can be used to measure the dimension of a pattern formed on a specimen based on the waveform.

To perform dimension measurement or defect inspection of a fine pattern formed on the wafer 6 using the electron scanning microscope, a measuring position or a position of an object to be inspected on the wafer 6 should correspond to a beam irradiating position. A specimen stage 7 is held by a driving mechanism that moves the wafer 6 at least in the X and Y directions (in a case where the electron beam optical axis is defined as a Z axis) to thereby achieve the movement.

Since a foreign object deteriorates the wafer 6 due to a fine pattern engraved thereon, it is transferred from a production device and the like to the electron scanning microscope in a state of being housed in a wafer casing 13 in which high cleanliness is maintained compared to a circumferential environment. The wafer 6 is taken out from the wafer casing 13 by a robot 12 placed in a local exhaust chamber 11 subjected to local ventilation and delivered to a device (not shown) that determines the direction of a wafer 6a. The wafer 6a whose direction is adjusted by the device waits on the robot 12 until it is introduced to an exchange chamber 10 for preliminary evacuation.

In the exchange chamber 10 that enables specimen delivery between an aerial space and a vacuum space, two valves of a specimen chamber valve 8 and an exchange chamber valve 14 are provided to be selectively opened during the specimen delivery. When the wafer 6a is introduced to the exchange chamber 10, firstly, after an atmospheric state of the exchange chamber 10 is made, the exchange chamber valve 14 is opened, and the wafer 6a is introduced into the exchange chamber 10 by the robot 12. After a wafer 6b is introduced in the exchange chamber 10, an exchange chamber valve 14 is closed to evacuate the exchange chamber 10. The evacuation is performed such that, firstly, a not-shown roughing pump is used to evacuate some degree of pressure, and the roughing pump is switched to an exchange chamber pump 10a to continue the evacuation to approach the degree of vacuum of a specimen chamber 9.

At this time, considering throughput, when the pressure difference between the specimen chamber 9 and the exchange chamber 10 becomes some degree of value (for example, the pressure difference of $10^2$ Pa or less (triple-digit pressure difference is the maximum)), the specimen chamber valve 8 is opened to replace the wafer 6b in the exchange chamber 10 with a wafer 6c in the specimen chamber 9. After the replacement, the specimen chamber valve 8 is closed. After the specimen chamber valve 8 is closed, a specimen chamber pump 9a is opened to maintain the vacuum pressure in the specimen chamber 9.

As described above, since the specimen chamber valve 8 is opened before the pressure of the specimen chamber 9 corresponds to the pressure of the exchange chamber 10 considering throughput, the pressure of the specimen chamber 9 is temporarily increased (the degree of vacuum is deteriorated).

A partition for maintaining an atmosphere around an electron source 1a in high vacuum is provided between the electron source 1a the specimen chamber 9, and to this partition, an opening (aperture) 17 that allows an electron beam to pass is provided. Due to existence of the aperture 17, the specimen chamber 9 is in the state in which a space reaching the electron gun 1 is communicated therewith. While the atmosphere of the electron source 1a has the pressure difference from that of the specimen chamber 9 by a differential evacuation structure, a location of the chip of the electron source 1a and the a location of the aperture 17 are provided on the electron beam optical axis (an ideal optical axis when the electron beam is not deflected) and the specimen chamber 9 exists on the electron beam optical axis. That is, influence of vacuum fluctuation of the specimen chamber 9 could reach the electron source 1a.

Figure 2:
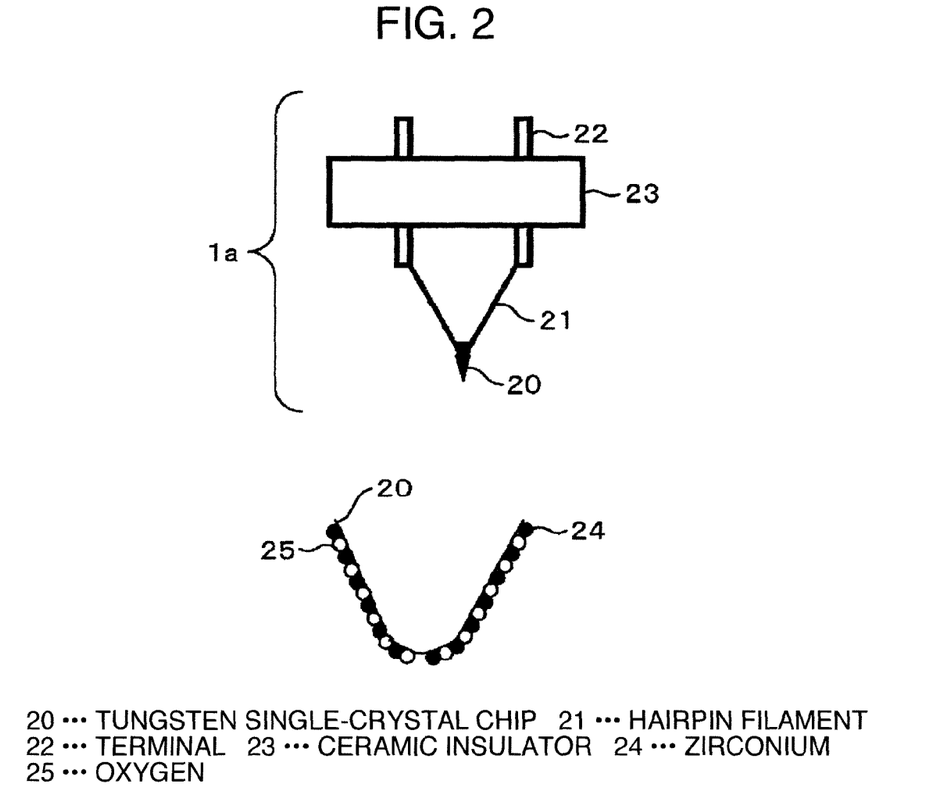
FIG. 2 is a schematic configuration diagram of a Schottky emission electron source.

FIG. 2 shows an example of the configuration of the electron source 1a. The electron source 1a includes a tungsten <100> single-crystal chip 20, a hairpin filament 21 made of a tungsten single-crystal line, a terminal 22 made of stainless etc. in which the filament is spot-weld and a ceramic insulator 23 fixing these components. The electron source 1a is used as a Schottky emitter that reduces work function of tungsten by covering a surface of a specific tungsten single-crystal chip having high activation energy with an adsorption layer of zirconium 24 and oxygen 25.

Since the Schottky emission electron source as shown in FIG. 2 has a high brightness and its energy width is small, the probe diameter can be squeezed even in a low accelerating voltage, so that it is frequently used as an electron source for surface observation of a semiconductor material or device.

On the other hand, as described above, when the specimen chamber valve 8 is opened relatively early for improvement of throughput, a pressure fluctuation occurs in the specimen chamber 9. The main cause of this pressure fluctuation is pressure difference caused when the wafer 6 is introduced into the specimen chamber 9 (see FIG. 1), moisture adsorbed by the wafer 6 or a material applied to the wafer 6. Especially, when the moisture is left in vacuum for a long period of time, it is decomposed into hydrogen and oxygen. When this oxygen is attached to a surface of the tungsten single-crystal chip, a covering phenomenon occurring in the adsorption layers of zirconium and oxygen is prevented, which could deteriorate a function of the Schottky emission electron source.

In this embodiment, a shutter member which can be disposed on the electron beam optical axis and does not contact the aperture etc. and an application method of the shutter member are explained.

Figure 3:
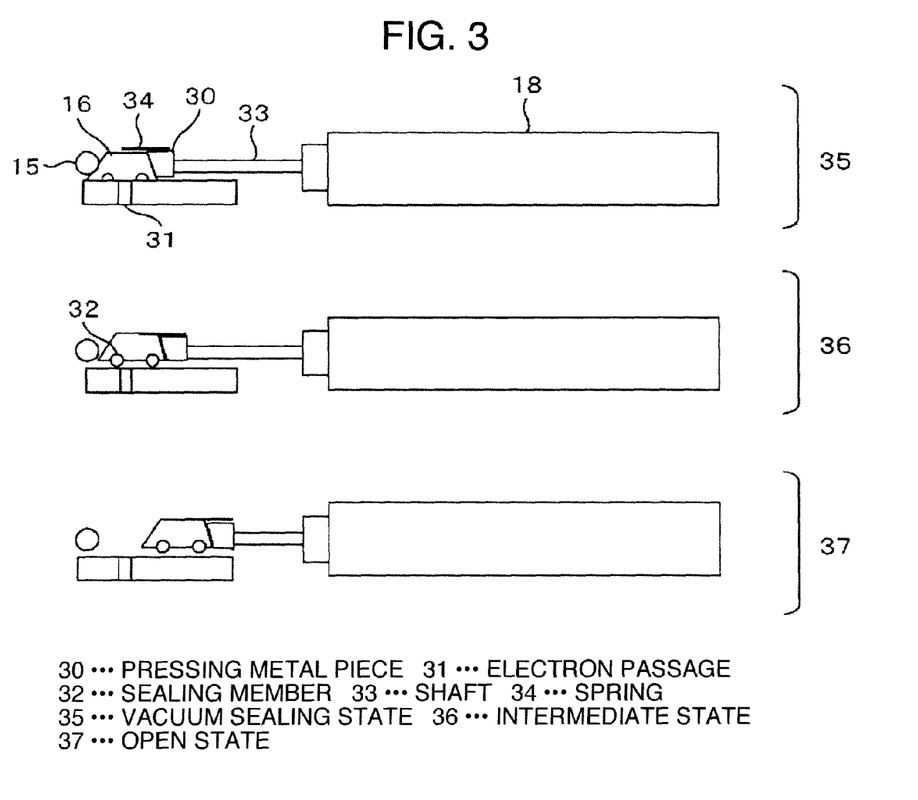
FIG. 3 is a detailed explanation diagram of a gate valve.

FIG. 3 is a drawing explaining an example of the shutter member. In this embodiment, an example that a gate valve for vacuum sealing is used as the shutter member will be explained. The gate valve includes a valve body drive assembly 18 that is a driving mechanism that drives the shutter member, a shaft 33 that is linearly moved in the vertical direction to the electron beam optical axis by the valve body drive assembly, a pressing metal piece 30 having an inclined surface on its tip portion, a valve body 16 that has an inclined surface abutting the inclined surface provided on the pressing metal piece 30 and moves downward (to the side of specimen chamber) by pressing operation of the shaft 33, a sealing member 32 that blocks an atmosphere of upper and lower spaces of the aperture, a valve body receptacle 15 that converts the pressing force of the shaft 33 into a downward pressing force, and a spring 34 having a sufficient spring force to lift the valve body 16.

Figure 6:
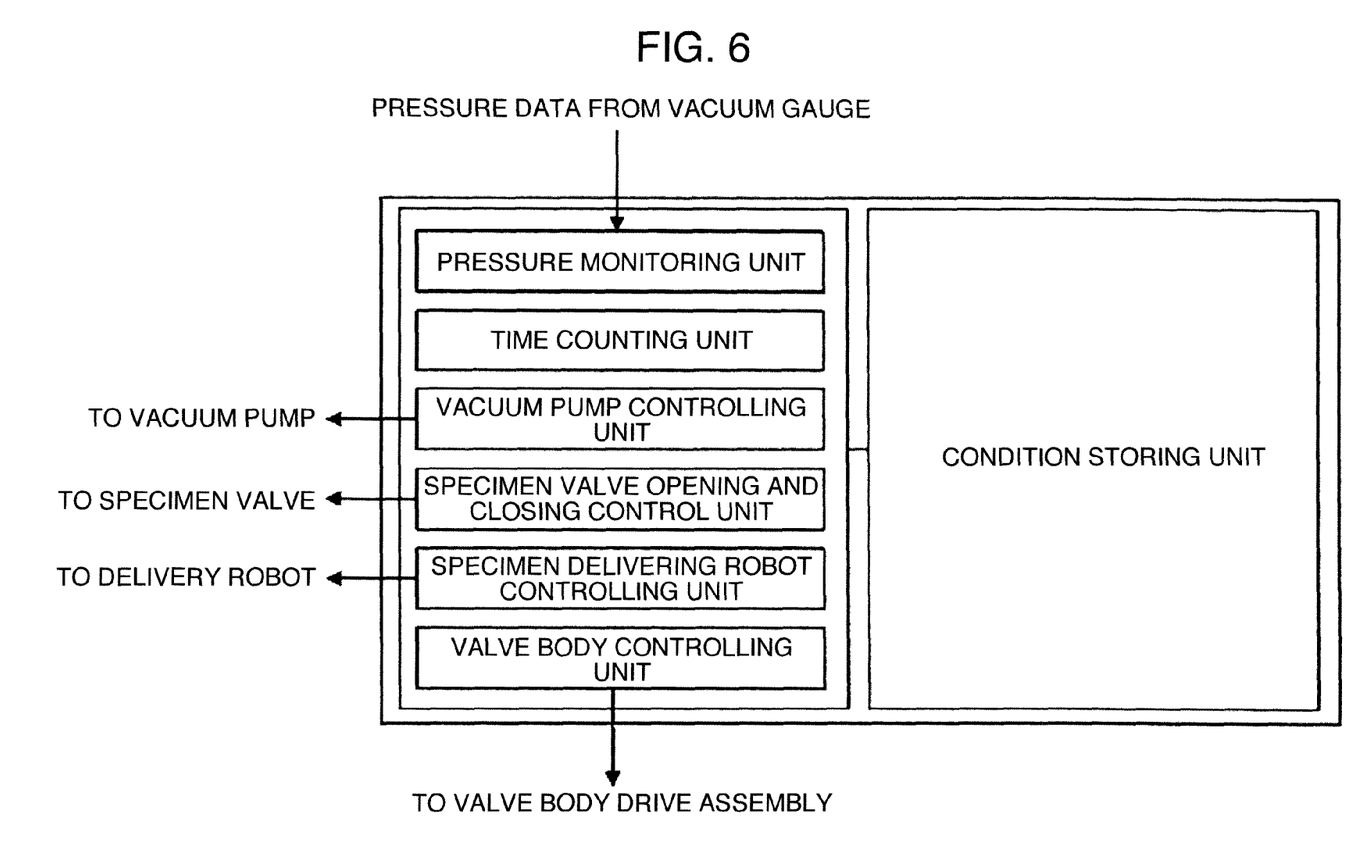
FIG. 6 is a drawing explaining a summary of the distribution system of the electron scanning microscope and a control device that controls the gate valve.

Moreover, the gate valve shown in FIG. 3 can be switched among at least three modes of an open state 37, a vacuum sealing state 35 and an intermediate state 36, and is controlled by a control device as shown in FIG. 6. The control device shown in FIG. 6 mainly includes a pressure monitoring unit that monitors pressure data obtained by a vacuum gauge 42 (see FIG. 4) provided on the exchange chamber 10, a time counting unit that counts the time until it reaches a predetermined degree of vacuum, a vacuum pump controlling UNIT that controls a vacuum pump based on a predetermined condition, a specimen valve opening and closing control unit that controls the opening and closing of the valve (the specimen chamber valve 8 and the exchange chamber valve 14) at a predetermined timing, the robot 12 that delivers a specimen between the local exhaust chamber 11 and the exchange chamber 10, a specimen delivering robot controlling unit that controls a robot 41 that delivers the specimen between the exchange chamber 10 and the specimen chamber 9, a valve body controlling portion that controls the valve body drive assembly 18 shown in FIG. 3, and a condition storing unit that stores control conditions of these controlling units.

The valve body controlling unit controls the valve body drive assembly such that a location of the valve body 16 is maintained in at least the three states as described above, and a driving signal etc. corresponding to a valve body position is stored in the condition storing unit. The three modes are as follows.

The first is a first mode in which, when an electron beam emitted from the electron source 1a is irradiated to the wafer 6c, the valve body 16 is removed from the aperture 17 to completely open a passage for the electron beam (an open state 37: the second location). The valve body drive assembly 18 may be constituted by a motor.

Next is a second mode in which, when the specimen chamber 9 is open to the air in the case where an electron beam is not irradiated or the specimen chamber 9 is repaired, to thereby generate a large pressure difference with the electron source, a sealing surface is pressed to the side of the aperture 17 by nipping the pressing metal piece 30 with the valve body 16 and the valve body receptacle 15 (a vacuum sealing state 35).

The last is a third mode in which, when the specimen is delivered between the specimen chamber 9 and the exchange chamber 10, while the valve body 16 is located in the electron beam optical axis, the valve body 16 is not pressed to the aperture 17 (a partition on which the aperture 17 is provided) as in the second mode (an intermediate state 36: the first location). In the third mode, by providing a clearance between the sealing member 32 and the partition, the valve body 16 floats from the partition. This third mode is to block molecules etc. linearly moving from the side of the specimen chamber to the electron source without pressing the valve body to the partition as described above, in order to eliminate influence generated at the time of the opening of the specimen chamber valve 8, and accordingly, the third mode should be maintained until such influence is eliminated. Since the time to maintain the third mode varies depending on a specimen to be handled, an arbitrary time setting can be desirably performed. In this way, the time to maintain the third mode is also stored in the condition storing unit of the control device shown in FIG. 6.

Figure 4:
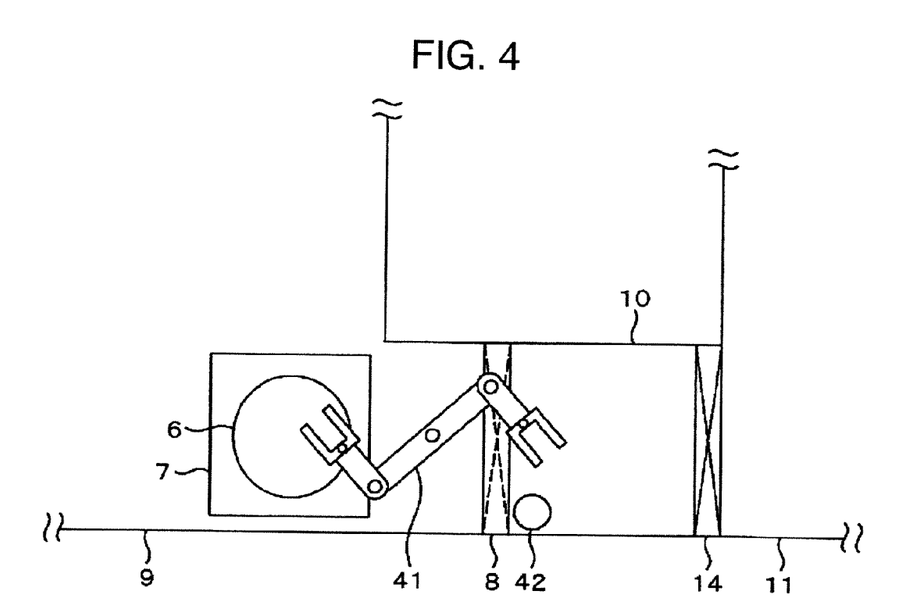
FIG. 4 is a plain view of a distribution system of the electron scanning microscope.
Figure 5:
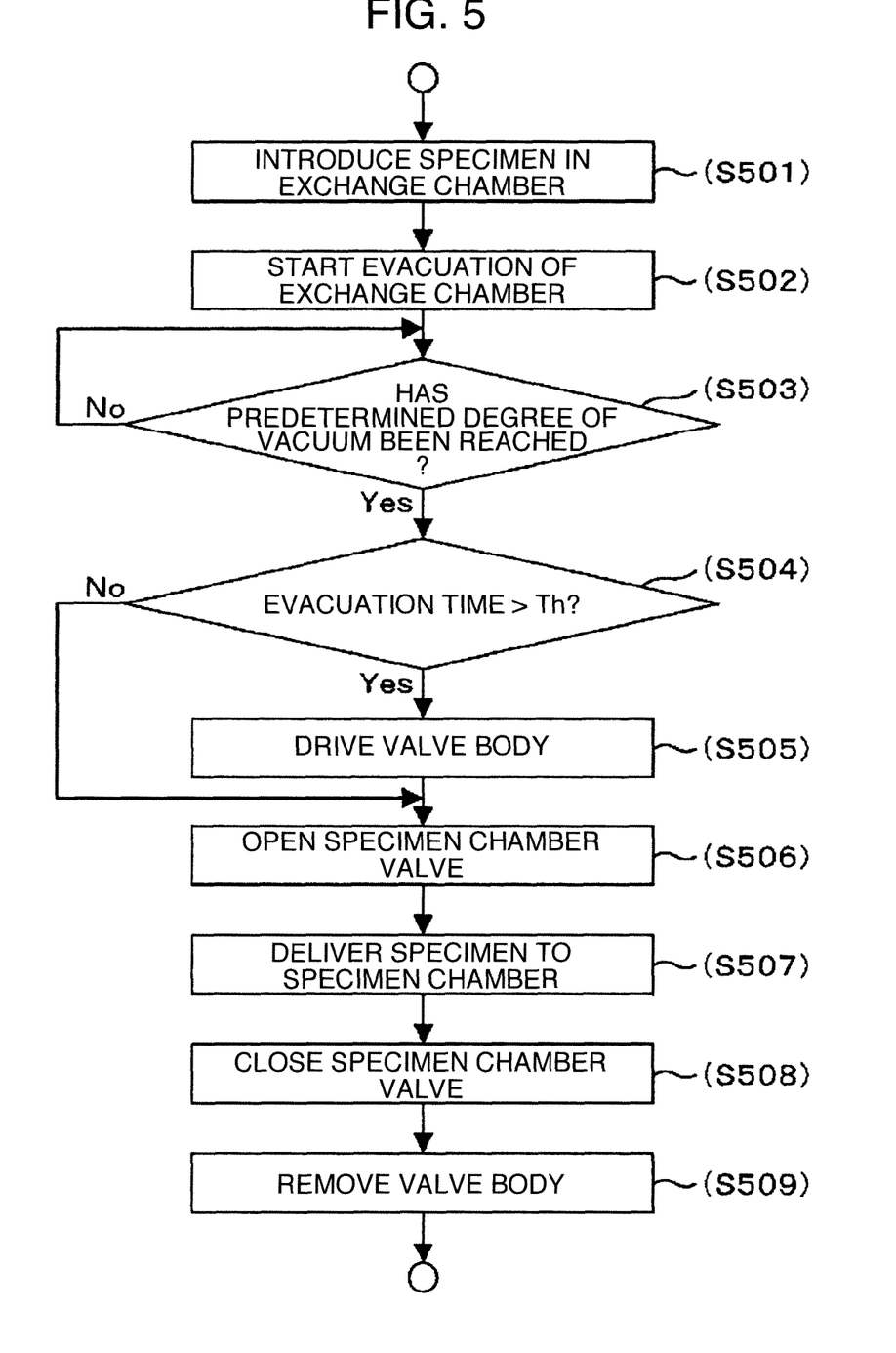
FIG. 5 is a flowchart explaining control steps of the distribution system of the electron scanning microscope and the gate valve.

Next, a concrete control method of the control device shown in FIG. 6 will be explained with reference to a flowchart in FIG. 5. Additionally, FIG. 4 is a plain view of a specimen delivery system unit of FIG. 1, and in the following explanation, FIG. 4 will also be cited.

Firstly, after the exchange chamber valve 14 is controlled to be opened by the specimen valve opening and closing controlling unit, by the robot 12 controlled by the specimen delivering robot controlling unit, the wafer 6a is delivered to the exchange chamber 10 (step 501). Next, the exchange chamber pump 10a is controlled by the vacuum pump controlling unit to evacuate the exchange chamber 10 (step 502). Next, through the vacuum gauge 42 as shown in FIG. 4, pressure in the exchange chamber 10 is monitored at the pressure monitoring unit, and if the pressure in the exchange chamber 10 reaches a predetermined value, it goes to the next step (step 503). In step 504, whether the evacuation time at the exchange chamber 10 exceeds a predetermined value is determined based on the vacuum reaching time measured by the time counting unit (step 504), and if it is determined to exceed the vacuum reaching time, by the control by the valve body controlling unit, mode switching is performed based on a predetermined rule to move the valve body 16 (step 505). Needless to say, if switching to a mode to be switched has been already made, the valve position is not changed to maintain that state.

The reason for judging a threshold value of the evacuation time in step 504 is that, because it can be understood that, when a long-time evacuation is made, there are many molecules emitted from the specimen and the like, which greatly affects the electron source, while, when the evacuation is terminated in a short time, there are little molecules emitted, which rarely affects the electron source; corresponding different modes are used to these conditions. For example, when the evacuation time is longer than the threshold value, it is predicted that there are many molecules emitted, and therefore the valve body is completely closed (the second mode), and on the other hand, when the evacuation time is the threshold value or less, from the viewpoint that only molecules linearly moving toward the side of the electron source may be inhibited, the intermediate state (the third mode) is adopted. With such switching, life extension of the valve body can be achieved while inhibiting the influence of the molecules emitted to the electron source. Moreover, not only switching of the two modes, but also two threshold values may be provided to perform switching of three modes depending on the degree of the evacuation time.

Further, to switch between the first and third modes, the determination based on the threshold value may be performed. In this case, since the valve body does not contact the partition, a further life extension of the valve body can be achieved.

Next, the specimen chamber valve 8 is opened by the control according to the specimen valve opening and closing control unit (step 506), and by the control according to the specimen delivering robot controlling unit, the wafer 6b is delivered to the specimen chamber 9 (step 507). It is important that, when the second or third mode is selected, the valve body is in the vacuum sealing state 35 or the intermediate state 36 at the time of opening the specimen chamber valve 8.

While this state is kept, after the specimen chamber valve 8 is closed (step 508), the valve body 16 is switched to the first mode (step 509) to open the electron beam passage. Additionally, since a valve body removal step (step 509) may be performed in a state in which the degree of vacuum is sufficiently increased, the removal step may be performed simultaneously with the step 507 or step 508. In this case, the step 509 may be performed when the degree of vacuum obtained by the vacuum gauge 42 or a vacuum gauge (not shown) provided on the side of the specimen chamber 9 exceeds a predetermined threshold value (when a predetermined high vacuum or more is reached).

Moreover, the step 509 may be performed when a predetermined time has been elapsed or when the degree of vacuum reaches a predetermined value or more, after the specimen chamber valve 8 is closed. Even when a waiting time is provided until the valve body removal in this way, the degree of vacuum that is once lowered can be increased using two pumps of the specimen chamber pump 9a and the exchange chamber pump 10a, so that the evacuation time can be shortened compared to the case where the specimen chamber valve 8 is opened after the vacuum is sufficiently increased in the exchange chamber 10.

Additionally, a clearance to be provided between the valve body 16 and the partition on which an electron beam passage 31 is provided is balanced with the spring 34 that lifts the weight of the valve body 16, which achieves life extension of the sealing member 32 without contacting a surface of the aperture 17. As explained before, in the electron source 1a, the zirconium 24 has a high affinity for the oxygen 25. The probability that moisture included in pressure fluctuation of the specimen chamber 9 or the oxygen 25 sublimed from the moisture attached to the wafer 6c moves from the aperture 17 to reach the electron source 1a without a single collision with other molecules etc. during the movement can be obtained as follows.

In the case where $N_0$ gas molecules advance in the same direction, it is assumed that at the point advanced from a starting point by x, the number of molecules that have not yet collided be N(x) and the number of molecules that collide during advancement by dx from the starting point be dN (x), the relational expression is as follows.

$dN(x)=\mu N(x)dx$ ... an expression obtaining distribution of mean free path $dN(x)$: the number of molecules that collide while advancing by $dx$ $N(x)$: the number of molecules that have not collided at the time of advancing by $x$ $\mu$: a constant showing probability of collision    [Expression 1]

Since this is the sum of distances of all the $N_0$ molecules that have advanced by x until each molecule is collided and scattered, this is represented by the following expression.

$$\int_0^{N_0} x \cdot dN(x) \ldots$$    [Expression 2]

The sum of straight distances of mean free path

Since the mean free path is the average of distances that the molecules have advanced, if the sum of the straight distances of the mean free path is divided by $N_0$, the expression representing mean free path (I) can be obtained.

$1=1/\mu$

1: mean free path $\mu$: probability of collision    [Expression 3]

When this is substituted in the expression to obtain the distribution of mean free path, the expression is as follows.

$N(x)=N_0\exp(-x/1)$    [Expression 4]

When what percent of the initial molecules has not yet collided at the point that has advanced by mean free path 1 is obtained, if the advanced distance is the same as the mean free path, from x=1, the following expression can be obtained.

$N(1)/N_0=\exp(-1)=1/e=0.367$    [Expression 5]

Accordingly, it is found to be 36.7 percent.

By setting the valve body 16 shown in FIG. 3 to the intermediate state 36, the probability that the oxygen 25 that has passed through the electron passage 31 directly reaches the electron source 1a can be reduced.

This prevents the contact of the sealing member 32 of the valve body 16 even when throughput is improved, and replacement frequency is reduced by extending longevity, which in turn reduces the device stop time. Moreover, generation of foreign matters can be prevented since the sealing member 32 does not contact even when throughput is improved, and the electron source 1a is also stabilized, whereby reliability is improved.

REFERENCE SIGNS LIST 1 electron gun
2 mirror body
3 condenser lens
4 objective lens
5 gate valve
6 wafer
7 specimen stage
8 specimen chamber valve
9 specimen chamber
10 exchange chamber
11 local exhaust chamber
12 robot
13 wafer casing
14 exchange chamber valve
15 valve body receptacle
16 valve body
17 aperture
18 valve body drive assembly

The invention claimed is:

1. A charged particle beam device comprising:
a charged particle source;
a specimen stage that maintains a specimen on which a charged particle beam emitted from the charged particle source is irradiated;
a specimen chamber that sets an atmosphere in which the specimen exists as a vacuum state; and
an exchange chamber that evacuates a specimen atmosphere to be introduced to the specimen chamber,
the charged particle beam device further comprising a partition that is located between a charged particle source-side vacuum space and a specimen stage-side vacuum space, the partition further including an opening for the charged particle beam to pass through, a drive mechanism that moves a shutter member capable of separating the charged particle source-side vacuum space and the specimen stage-side vacuum space by pressing the partition between a first location within an optical axis of the charged particle beam and a second location outside the optical axis of the charged particle beam, and a control device that controls the drive mechanism,
wherein the first location is a location wherein the shutter member is distant from the partition, and the control device carries out control for opening a valve between the specimen chamber and the exchange chamber while keeping the shutter member in a state of being located in the first location.

2. The charged particle beam device according to claim 1, wherein the control device moves the shutter member between the first location and a location contacting the partition in the optical axis of the charged particle beam.

3. The charged particle beam device according to claim 1, wherein the control device determines a location of the shutter member at the time of opening the valve based on a reaching time of a predetermined degree of vacuum of the exchange chamber.

4. The charged particle beam device according to claim 3, wherein the control device carries out control for moving the shutter member such that the shutter member is located in a location contacting the partition in the optical axis of the charged particle beam when the reaching time exceeds a predetermined threshold value, while the shutter member is located in the first location when the reaching time is the threshold value or less.

5. The charged particle beam device according to claim 3, wherein the control device carries out control for moving the shutter member such that the shutter member is located in the first location when the reaching time exceeds a predetermined threshold, while the shutter member is located in the second location when the reaching time is the threshold value or less.

* * * * *